United States Patent
Morosawa et al.

(10) Patent No.: US 7,215,315 B2
(45) Date of Patent: May 8, 2007

(54) SHIFT REGISTER AND DISPLAY DRIVING DEVICE COMPRISING THE SAME

(75) Inventors: Katsuhiko Morosawa, Tachikawa (JP); Takumi Yamamoto, Fussa (JP)

(73) Assignee: Casio Computer Co., Ltd., Tokyo (JP)

(*) Notice: Subject to any disclaimer, the term of this patent is extended or adjusted under 35 U.S.C. 154(b) by 0 days.

(21) Appl. No.: 11/295,221

(22) Filed: Dec. 6, 2005

(65) Prior Publication Data

US 2006/0125518 A1 Jun. 15, 2006

(30) Foreign Application Priority Data

Dec. 10, 2004 (JP) ............................. 2004-358443

(51) Int. Cl.
*G09G 3/36* (2006.01)
*G11C 19/00* (2006.01)

(52) U.S. Cl. ........................................ 345/100; 377/64
(58) Field of Classification Search ................ 345/61, 345/87, 92, 100; 377/54–81
See application file for complete search history.

(56) References Cited

U.S. PATENT DOCUMENTS 6,392,627 B1 * 5/2002 Maekawa ..................... 345/98
6,580,411 B1 * 6/2003 Kubota et al. ................. 345/98
6,741,230 B2 * 5/2004 Sakai et al. .................... 345/99

* cited by examiner

*Primary Examiner*—Tarifur Chowdhury
*Assistant Examiner*—Mohammad A. Latif
(74) *Attorney, Agent, or Firm*—Frishauf, Holtz, Goodman & Chick, P.C.

(57) ABSTRACT

A shift circuit of a shift register includes an output terminal, an input terminal, a reset terminal. A voltage is applied to a first wiring in response to the output signal from the preceding stage shift circuit to the input terminal and in accordance with the predetermined voltage to the first wiring, outputting an externally applied signal to the output terminal. A voltage level of the first wiring is reduced in response to the output signal to the reset terminal by the preceding stage shift circuit. The voltage is applied to the second wiring in response to a change in the level of the voltage applied to the first wiring. The voltage is applied to a second wiring in response to the output signal to the reset terminal by the preceding stage shift circuit. A voltage level of the output signal is reduced in response to the predetermined voltage to the second wiring.

14 Claims, 9 Drawing Sheets

SHIFT REGISTER AND DISPLAY DRIVING DEVICE COMPRISING THE SAME

CROSS-REFERENCE TO RELATED APPLICATIONS

This application is based upon and claims the benefit of priority from prior Japanese Patent Application No. 2004-358443, filed Dec. 10, 2004, the entire contents of which are incorporated herein by reference.

BACKGROUND OF THE INVENTION

1. Field of the Invention

The present invention relates to a shift register having a plurality of stages including of a plurality of cascaded shift circuits and a method for driving the shift register, as well as a display driving device comprising the shift register to drive a display panel.

2. Description of the Related Art

Amorphous silicon thin-film transistors TFT (referred to as "a-SiTFTs" below) and polysilicon thin-film transistors (referred to as "p-SiTFTs" below) are used as, for example, display driving elements constituting pixels in a liquid crystal display panel.

The liquid crystal display panel has a plurality of scan lines and a plurality of signal lines. The scan lines and signal lines are respectively driven by a scan driver and a signal driver to display desired images. Specifically, the scan driver sequentially applies, to each scan line, a scan signal that selects a-SiTFTs or p-SiTFTs constituting display elements. The signal driver applies a voltage corresponding to display data to a liquid crystal capacitance constituting the display elements, via each signal line. This allows a display operation to be performed to display an image on the liquid crystal display panel.

On the other hand, in recent years, studies have been made of the use of a-SiTFTs or p-SiTFTs for constructing various circuits. For example, the technique described below has been developed and studied to reduce module sizes and thus costs. A shift register circuit is formed of a-SiTFTs or p-SiTFTs and applied to a scan driver or signal driver for a display driving device. Thus, the display driving device is integrated with the liquid crystal display panel.

However, a-SiTFTs and p-SiTFTs are inferior, in operational characteristics, to monocrystal Si-based transistors conventionally used to construct the scan and signal drivers. It is thus difficult to construct a circuit that is operationally stable and that exhibits a sufficient performance, using a-SiTFTs or p-SiTFTs.

FIG. 9 shows an example of a circuit configuration of shift circuits constituting the respective stages of a shift registers. The shift register is constructed by connecting n shift circuits (n is an integer equal to or larger than 1) in series. In this case, it is assumed that the transistor constituting the shift circuit is composed of an N-type a-SiTFT or N-type p-SiTFT.

In FIG. 9, when an output signal output by the shift circuit in the preceding stage is applied to an input terminal IN and an input control signal φ is input at a predetermined time, TFT (thin film transistor or MOS transistor) 111 is turned on to raise the potential at a contact NA in accordance with the signal level of the input signal. This turns on TFT 112 and TFT 113 to lower the potential at a contact NB. TFT 114 is thus turned off. At this time, when the signal level of a clock signal supplied to an input terminal CK switches from low to high, a high-level output signal is output from an output terminal OUT. Then, an output signal output by the shift circuit in the succeeding stage is applied to a reset terminal RST as a reset signal. Then, TFT 115 is turned on to emit charges accumulated at the contact NA to a low-potential power source Vss. This changes the potential at the contact NA to the low level. This turns off TFT 112 and TFT 113 to raise the potential at the contact NB. TFT 114 is thus turned on to change the output signal to the low level in accordance with a signal level (low level Vss) supplied to a control terminal CTL.

In this case, the following two-stage circuit operation is performed after the output signal output by the shift circuit in the succeeding stage is applied to the reset terminal RST as a reset signal and before the MOS transistor TFT 114 is turned on to change the output signal to the low level: TFT 115 is turned on to change the potential at the contact NA to the low level, and then TFT 112 and TFT 113 are turned off to raise the potential at the contact NB. A-SiTFTs and p-SiTFTs have a significantly lower mobility than monocrystal Si-based transistors. Accordingly, TFTs operate more slowly than monocrystal Si-based transistors. Consequently, after the application of the reset signal, a long time is required to change the output signal to the low level. That is, a fall in the output signal is relatively delayed. Thus, with such a shift register using a plurality of shift circuits composed of a-SiTFTs or p-SiTFTs, the circuits must have an increased clock frequency. However, such an increase in clock frequency may delay the fall in the output signal from each shift circuit, thus making circuit operations unstable. This may lead to malfunctioning.

BRIEF SUMMARY OF THE INVENTION

The present invention provides a shift register having the advantage of being able to suppress malfunctioning if the operating frequency of circuits is increased to some degree, thus stabilizing circuit operations in a display driving device comprising the shift register.

To achieve the advantage, a first aspect of the present invention provides a shift register comprising a plurality of stages, each of the stages comprising one of cascaded shift circuits, each of the shift circuits comprising:

an output terminal which sequentially outputs an output signal and which applies the output signal to the shift circuit in a succeeding stage;

an input terminal to which the output signal from the shift circuit in a preceding stage is applied;

a reset terminal to which the output signal from the shift circuit in the succeeding stage is applied;

a first wiring;

a second wiring;

a section for applying a predetermined voltage to the first wiring in response to the input of the output signal from the shift circuit in the preceding stage to the input terminal and in accordance with the application of the predetermined voltage to the first wiring, outputting an externally applied signal of a predetermined level to the output terminal as the output signal;

a section for reducing a voltage level of the first wiring in response to the application of the output signal to the reset terminal by the shift circuit in the succeeding stage;

a section for applying the predetermined voltage to the second wiring in response to a change in the level of the voltage applied to the first wiring;

a section for applying the predetermined voltage to the second wiring in response to the application of the output signal to the reset terminal by the shift circuit in the succeeding stage; and a section for reducing a voltage level of the output signal in response to the application of the predetermined voltage to the second wiring.

Preferably, the section for outputting the signal of the predetermined level as the output signal has a first transistor which applies the predetermined voltage to the first wiring in response to the input of the output signal to the input terminal, and a second transistor which outputs the signal of the predetermined level to the output terminal wire in response to the application of the predetermined voltage to the first wiring, the section for reducing the voltage level of the first wiring in response to the application of the output signal to the reset terminal has a third transistor, the section for applying the predetermined voltage to the second wiring in accordance with the change in the voltage level of the first wiring has a fourth transistor, the section for applying the predetermined voltage to the second wiring in response to the application of the output signal to the reset terminal has a fifth transistor, and the section for reducing the voltage level of the output signal in response to the application of the predetermined voltage to the second wiring has a sixth transistor.

The first transistor and the third transistor may include current paths connected in series, a junction between the first transistor and the third transistor is connected to the first wiring, and the predetermined voltage is applied to one end of the current paths which is closer to the first transistor, wherein a control terminal of the first transistor is connected to the input terminal, and a control terminal of the third transistor is connected to the reset terminal.

The second transistor and the sixth transistor may include current paths connected in series, a junction between the second transistor and the sixth transistor is connected to the output terminal, the signal of the predetermined level being applied to one end of the current paths which is closer to the second transistor, wherein a control terminal of the second transistor is connected to the first wiring, and a control terminal of the sixth transistor is connected to the second wiring.

The fourth transistor may include a current path one end of which is connected to the second wiring and a control terminal connected to the first wiring.

The fifth transistor may include a current path having one end to which the predetermined voltage is applied and the other end connected to the second wiring, and a control terminal connected to the reset terminal.

Each of the first to sixth transistor preferably comprises an amorphous silicon thin-film transistor or a polysilicon thin-film transistor.

To achieve the advantage, a second aspect of the present invention provides a method of driving a shift registers comprising a plurality of stages, wherein each of the stages has one of shift circuits which are cascaded together and each of which sequentially out puts an output signal, the shift circuit applying the output signal to a succeeding stage, the method comprising:

applying a predetermined voltage to a first wiring in response to the input of the output signal from the shift circuit in a preceding stage to the first wiring;

outputting an externally applied signal of a predetermined level to the output terminal as the output signal, in response to the application of the predetermined voltage to the first wiring;

reducing a voltage level of the first wiring in response to application of the output signal by the shift circuit in a succeeding stage;

applying the predetermined voltage to a second wiring in accordance with a change in the voltage level of the first wiring;

applying the predetermined voltage to the second wiring in response to the application of the output signal by the shift circuit in the succeeding stage; and reducing a voltage level of the output signal in response to the application of the predetermined voltage to the second wiring.

The applying the predetermined voltage to the second wiring in response to the application of the output signal by the shift circuit in the succeeding stage may be carried out via, one transistor having a current path having one end to which the predetermined voltage is applied and the other end connected to the second wiring, and a control terminal to which the output signal from the shift circuit in the succeeding stage is applied.

To achieve the advantage, a third aspect of the present invention provides a display driving device which drives a display panel, wherein each of the stages of the shift register comprises one of cascaded shift circuits, the shift circuit comprising:

an output terminal which sequentially outputs an output signal and which applies the output signal to the shift circuit in a succeeding stage;

an input terminal to which the output signal from the shift circuit in a preceding stage is applied;

a reset terminal to which the output signal from the shift circuit in the succeeding stage is applied;

a first wiring;

a second wiring;

a section for applying a predetermined voltage to the first wiring in response to the input of the output signal from the shift circuit in the preceding stage to the input terminal;

a section for outputting an externally applied signal of a predetermined level to the output terminal as the output signal, in response to the application of the predetermined voltage to the first wiring;

a section for reducing a voltage level of the first wiring in response to the application of the output signal to the reset terminal by the shift circuit in the succeeding stage;

a section for applying the predetermined voltage to the second wiring in response to a change in the level of the voltage applied to the first wiring;

a section for applying the predetermined voltage to the second wiring in response to the application of the output signal to the reset terminal by the shift circuit in the succeeding stage; and a section for reducing a voltage level of the output signal in response to the application of the predetermined voltage to the second wiring.

Preferably, the section for applying the predetermined voltage to the first wiring in response to the input of the output signal to the input terminal has a first transistor, wherein the section for outputting the signal of the predetermined level to the output terminal wire in response to the application of the predetermined voltage to the first wiring has a second transistor, the section for reducing the voltage level of the first wiring in response to the application of the output signal to the reset terminal has a third transistor, the section for applying the predetermined voltage to the second wiring in accordance with the change in the voltage level of the first wiring has a fourth transistor, the section for applying the predetermined voltage to the second wiring in response to the application of the output signal to the reset terminal has a fifth transistor, and the section for reducing the voltage level of the output signal in response to the application of the predetermined voltage to the second wiring has a sixth transistor.

The first transistor and the third transistor may include current paths connected in series, a junction between the first transistor and the third transistor is connected to the first wiring, and the predetermined voltage is applied to one end of the current paths which is closer to the first transistor, wherein a control terminal of the first transistor is connected to the input terminal, and a control terminal of the third transistor is connected to the reset terminal.

The second transistor and the sixth transistor may include current paths connected in series, a junction between the second transistor and the sixth transistor is connected to the output terminal, and the signal of the predetermined level is applied to one end of the current paths which is closer to the second transistor, wherein a control terminal of the second transistor is connected to the first wiring, and a control terminal of the sixth transistor is connected to the second wiring.

The fourth transistor may include a current path one end of which is connected to the second wiring and a control terminal is connected to the first.

The fifth transistor may include a current path having one end to which the predetermined voltage is applied and the other end connected to the second wiring, and a control terminal is connected to the reset terminal.

The first to sixth transistors may comprise amorphous silicon thin-film transistors or polysilicon thin-film transistors.

DETAILED DESCRIPTION OF THE INVENTION

Figure 1:
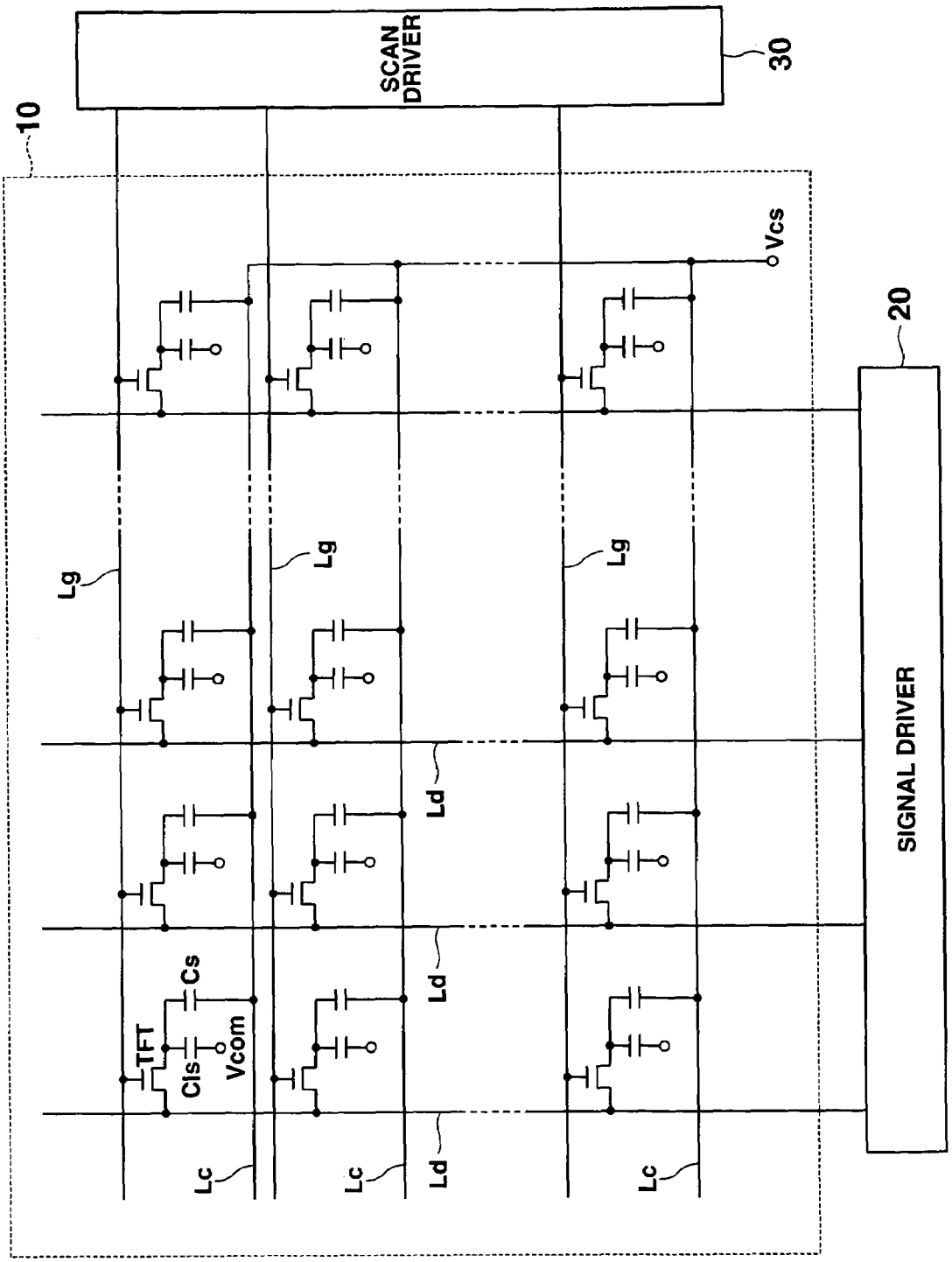
FIG. 1 is a diagram showing the configuration of an essential part of a liquid crystal display apparatus in accordance with the present invention.

On the basis of an embodiment shown in the drawings, description will be given of a shift register, a method for driving the shift register, and a display driving device comprising the shift register in accordance with the present invention.

In the description of the present embodiment, an example of a display driving device is a scan driver for a liquid crystal display apparatus to which a shift register in accordance with the present invention is applied. However, the present invention is not limited to this but is applicable to, for example, a signal driver.

FIG. 1 is a diagram showing the configuration of an essential part of a liquid crystal display apparatus in accordance with the present invention.

The liquid crystal display apparatus comprises a display panel 10, a signal driver 20, a scan driver 30, and the like. The display panel 10 comprises a plurality of signal lines Ld disposed across the column, a plurality of scan lines Lg disposed across the row, a plurality of pixel electrodes each arranged in the vicinity of the intersecting point between the corresponding signal line Ld and the scan line Lg. The signal and scan lines and pixel electrodes are arranged on a transparent first substrate. A common electrode (opposite electrode) is placed on a second substrate opposite the pixel electrodes. A liquid crystal capacitance Clc is formed by a liquid crystal filled and held between the pixel electrodes and the common electrode. A supplementary capacitance Cs is connected in parallel with the liquid crystal capacitance Clc and having a first end connected to an input terminal for a predetermined voltage Vcs via a supplementary capacitance wire Lc to hold a signal voltage applied to the liquid crystal capacitance Clc. TFT is electrically connected to the capacitances Clc, Cs. Each of the TETs has a gate terminal connected to the corresponding scan line Lg, a source terminal connected to the corresponding pixel electrode, and a drain terminal connected to the corresponding signal line Ld.

In the liquid crystal display apparatus comprising the display panel 10 having such a configuration, when the scan driver 30 sequentially applies a scan signal to the scan line Lg in each row to select the scan line Lg, the corresponding TFTs are turned on. The signal driver 20 outputs a display signal voltage to the signal line Ld, and the display signal voltage is then applied to each pixel electrode via the corresponding TFT. Then, the potential difference between the display signal voltage and a common signal voltage Vcom applied to the common electrode is charged in the liquid crystal capacitance Clc of each display pixel. This controls the orientation of liquid crystal molecules in each display pixel in accordance with the potential difference. Thus, desired image information is displayed on the display panel 10. Here, the scan driver 30 has a shift register that sequentially applies a scan signal to the scan line Lg in each row.

Figure 2:
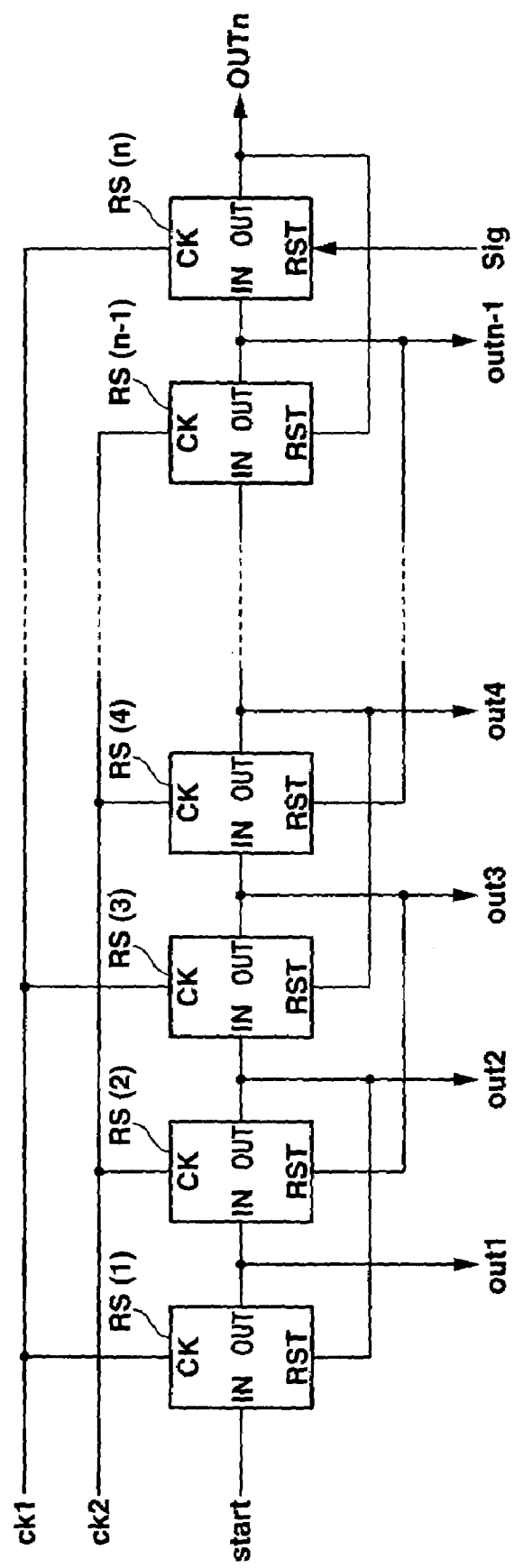
FIG. 2 is a circuit diagram of a shift register in accordance with the present embodiment.

FIG. 2 is a circuit diagram of a shift register in accordance with the present embodiment.

Provided that the number of the scan lines Lg is n (an integer equal to or larger than 1), the shift register is composed of n cascaded shift circuits (stages) RS(1) to RS(n).

Each shift circuit RS has an input terminal IN, an output terminal OUT, a clock terminal CK, and a reset terminal (control terminal) RST. An external circuit such as a controller circuit inputs a start signal to the input terminal IN of the first shift circuit RS(1). An output signal out(k−1) from the output terminal of the shift circuit in the preceding stage RS(k−1) (k is an integer between 2 and n) is input to the input terminal IN of each of the shift circuits RS(2) to RS(n). Moreover, an output signal out(k) is output to the corresponding scan line Lg.

The external circuit inputs a clock signal ck1 to the clock terminals CK of odd numbered shift circuits RS(k−1). The external circuit inputs a clock signal ck2 to the clock terminals CK of even numbered shift circuits RS(k). Here, the clock signals ck1 and ck2 are reversed pulse signals. An output signal out(k+1) from the shift circuit in the succeeding stage RS(k+1) (k is an integer between 1 and n−1) is input to the reset terminal RST of each shift circuit RS(k) except the final stage RS(n). The external circuit inputs a signal (sig) to the reset terminal RST of the final shift circuit RS(n).

Figure 3:
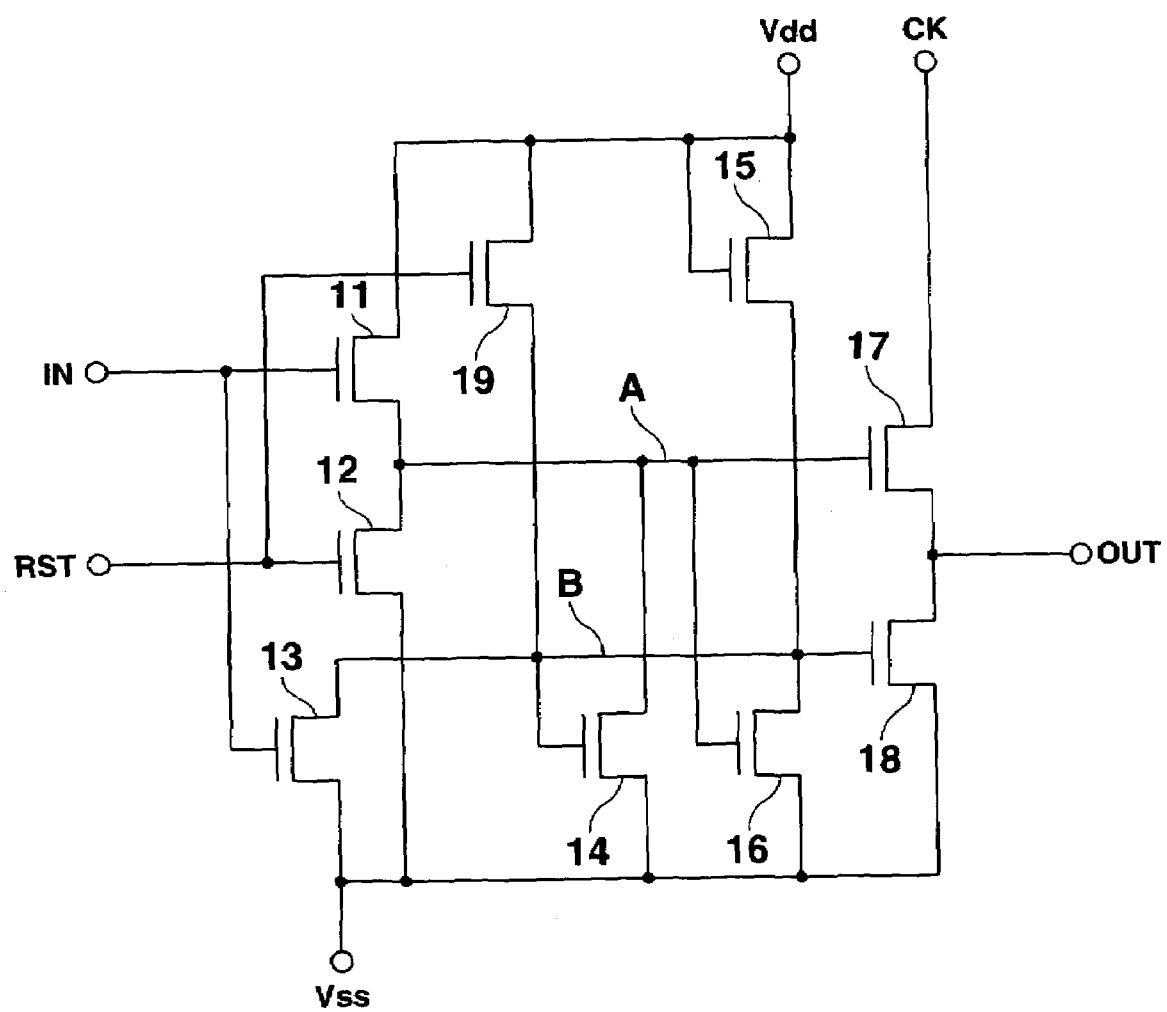
FIG. 3 is a circuit diagram of shift circuits in accordance with the present embodiment.

FIG. 3 is a circuit diagram of the shift circuit in accordance with the present embodiment.

In FIG. 3, this shift circuit is assumed to be the shift circuit RS(k), located in the k-th stage. A gate terminal (control terminal) of TFT 11 (first transistor) is connected to the input terminal IN. The output signal out(k−1) is input to the gate terminal. A voltage Vdd is applied to a drain terminal of TFT 11. A source terminal of TFT 11 is connected to a node A (first wiring). A gate terminal (control terminal) of TFT 12 (third transistor) is connected to the reset terminal RST. The output signal out(k+1) from the circuit in the succeeding stage is input to the gate terminal. A drain terminal of TFT 12 is connected to the node A. A voltage Vss is applied to a source terminal of TFT 12.

A gate terminal of TFT 13 is connected to the input terminal IN. A drain terminal of TFT 13 is connected to a node B. The voltage Vss is applied to a source terminal of TFT 13. A gate terminal of TFT 14 is connected to the node B. A drain terminal of TFT 14 is connected to the node A. The voltage Vss is applied to a source terminal of TFT 14. The voltage Vdd is applied to a gate and drain terminals of TFT 15. A source terminal of TFT 15 is connected to the node B. A gate terminal (control terminal) of TFT 16 (fourth transistor) is connected to the node A. A drain terminal of TFT 16 is connected to the node B (second wiring). The voltage Vss is applied to a source terminal of TFT 16.

A gate terminal (control terminal) of TFT 17 (second transistor) is connected to the node A. A drain terminal of TFT 17 is connected to the clock terminal CK. The clock signal ck1 or ck2 is input to the drain terminal of TFT 17. A source terminal of TFT 17 is connected to the output terminal OUT. A gate terminal (control terminal) of TFT 18 is connected to the node B. A drain terminal of TFT 18 is connected to the output terminal OUT. The voltage Vss is applied to a source terminal of TFT 18. A gate terminal (control terminal) of TFT 19 (fifth transistor) is connected to the reset terminal RST. The voltage Vdd is applied to a drain terminal of TFT 19. A source terminal of TFT 19 is connected to the node B.

TFTs are all composed of amorphous silicon thin-film transistors or polysilicon thin-film transistors.

Figure 4:
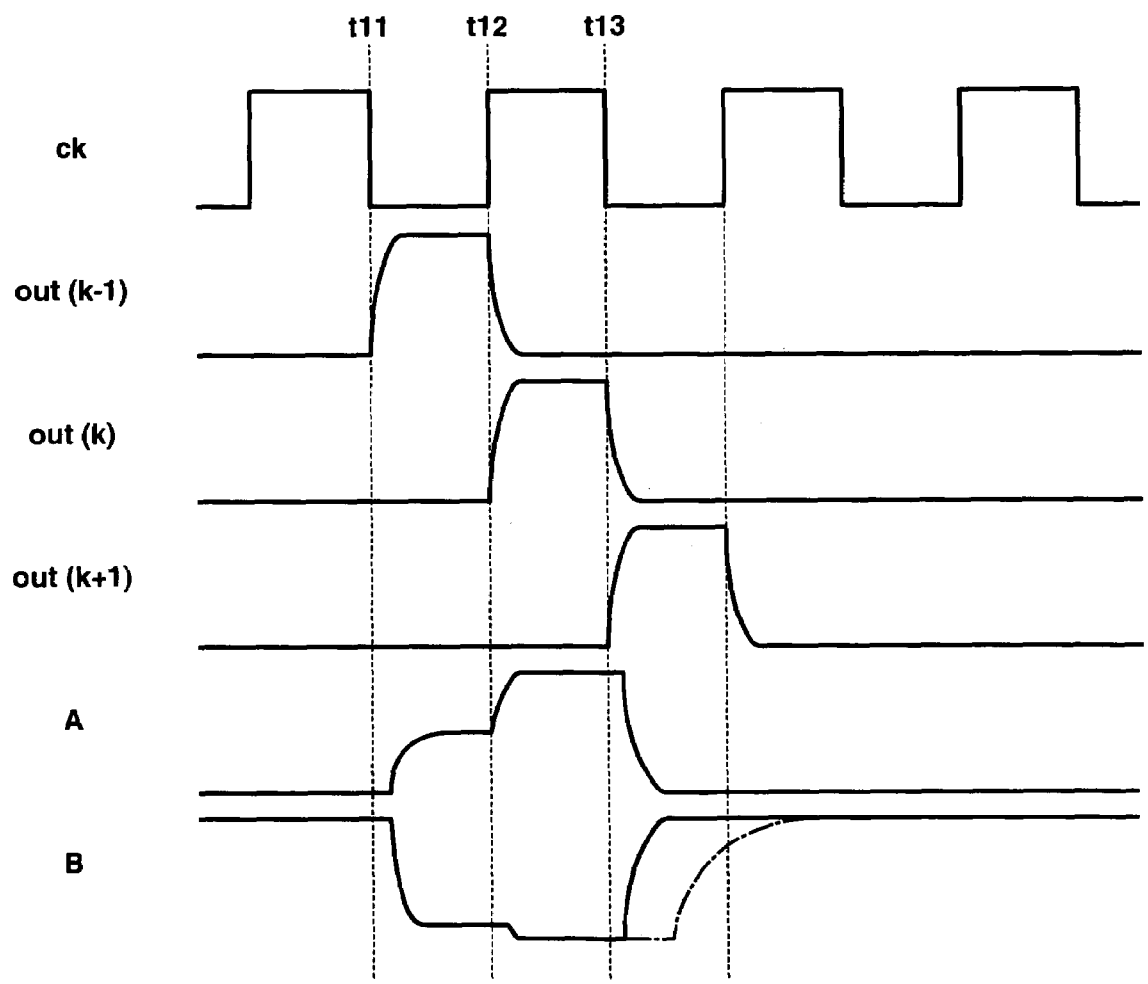
FIG. 4 is a signal waveform diagram of each section of the shift circuit in accordance with the present embodiment.

FIG. 4 is a signal waveform diagram of each section of the shift circuit in accordance with the present embodiment.

Figure 5:
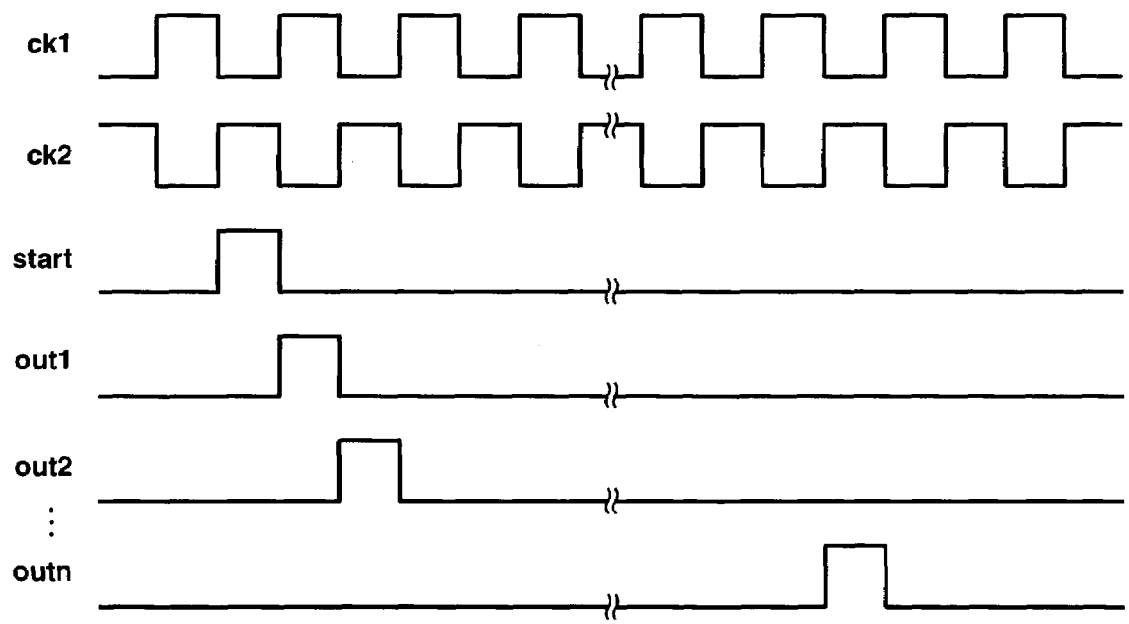
FIG. 5 is a signal waveform diagram of the shift register in accordance with the present embodiment.

FIG. 5 is a signal waveform diagram of the shift register in accordance with the present embodiment.

FIG. 4 shows the following signals in the following order from the top to bottom of the figure: the clock signal ck, input to the clock terminal CK, the output signal out(k−1) from the circuit in the preceding stage, which is input to the input terminal IN, the output signal out(k), output from the output terminal OUT, the output signal out(k+1) from the circuit in the succeeding stage, which is input to the reset terminal RST, the potential at the node A (first wiring), and the potential at the node B (second wiring). Here, the clock signal ck is the clock signal ck1 or ck2. First, at a time t11, the output signal out(k−1) from the circuit in the preceding stage, which is input to the input terminal IN, changes to the high level. Then, TFT 11 is turned on to raise the potential at the node A. Further, TFT 13 is turned on to lower the potential at the node B to the voltage Vss.

When the node A reaches a predetermined voltage, TFT 16 and TFT 17 are turned on. A current thus flows between the drain terminal and source terminal of TFT 16 to lower the potential at the node B. When the potential at the node B becomes a low potential level, TFT 18 is turned off. Accordingly, at a time t12, the clock signal ck changes to the high level to cause a current to flow between the drain terminal and source terminal of TFT 17. This changes the output signal out(k) to the high level. Further, the voltage of the clock signal ck is applied to the output terminal OUT via TFT 17. This further raises the potential at the node A.

The output signal out(k) is input to the input terminal IN of the (k+1) shift circuit in the succeeding stage RS(k+1). Then, at a time T13, the output signal out(k+1) is output by the (k+1) shift circuit in the succeeding stage RS(k+1). The output signal out(k+1) is input to the reset terminal RST of the shift circuit RS(k). This turns on TFT 12 to lower the potential at the node A. A decrease in the potential of the node A turns on TFT 16. Thus, a current flows though the node B via TFT 15 to raise the potential at the node B. Further, on this occasion, TFT 19 is turned on to rapidly raise the potential at the node B.

When the node B reaches a predetermined voltage, TFT 14 is turned on to lower the potential at the node A. This turns on TFT 17. Furthermore, TFT 18 is turned on to cause a current to flow between the drain terminal and source terminal of TFT 18. The output signal out(k) changes to the low level.

Now, description will be given of the effects of the configuration of the shift register in accordance with the present invention.

In the waveform in FIG. 4 which shows a variation in the potential at the node B (second wiring), a part shown by a one-dot chain line shows a variation in the potential of the node B observed if the shift circuit in accordance with the present invention shown in FIG. 3 does not comprises TFT 19 (fifth transistor). In this case, when at a time t13, the output signal out(k+1) from the circuit in the succeeding stage is input to the reset terminal RST as a reset signal, TET 12 is turned on to lower the potential at the node A (first wiring). A decrease in the potential at the node A turns off TFTs 17 and 16. A current thus flows through the node B (second wiring) via TFT 15 to raise the potential at the node B. When the node B reaches a predetermined voltage, TFTs 14 and 18 are turned on. This changes the output signal out(k), output from the output terminal OUT, to the low level. That is, in this case, after the reset signal is input to the reset terminal RST to raise the potential at the node B to turn on the TFT 18 and before the signal out(k) changes to the low level, the following two-stage circuit operation is performed: TFT 12 is turned on to lower the potential at the node A, and then TFT 16 is turned off to raise the potential at the node B. Consequently, the operating speeds of TFTs contribute to reducing the speed at which the potential at the node B falls as shown by the one-dot chain line in FIG. 4. This delays the rise of the output signal. Thus, if the clock frequency of the shift register is increased, the circuit operation is made unstable by the delay in the fall in the output signal from each shift circuit. This may lead to malfunctioning.

Now, a specific example of malfunctioning will be described.

Figure 6:
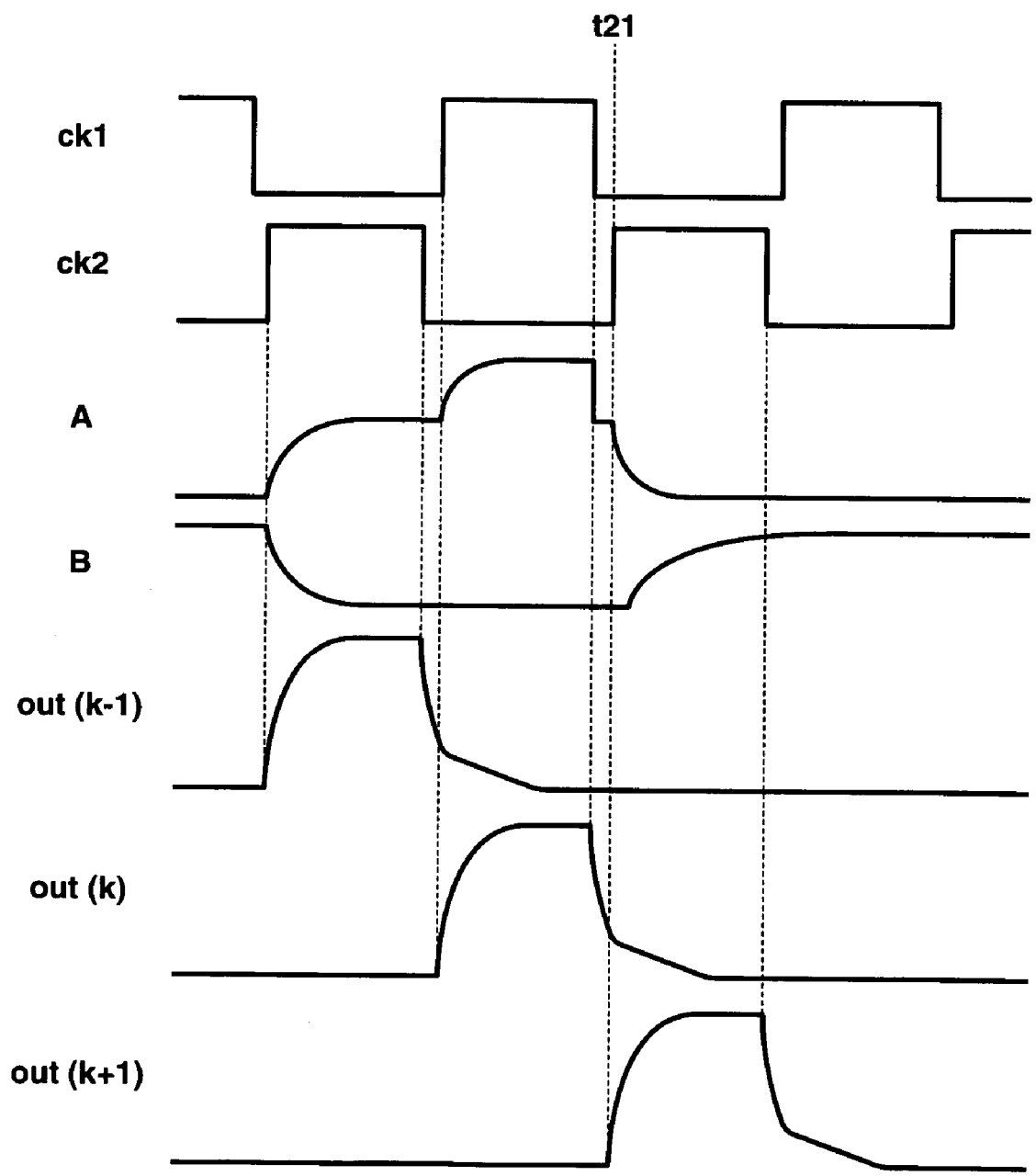
FIG. 6 is a signal waveform diagram illustrating the effects of the shift circuit in accordance with the present embodiment.
Figure 7:
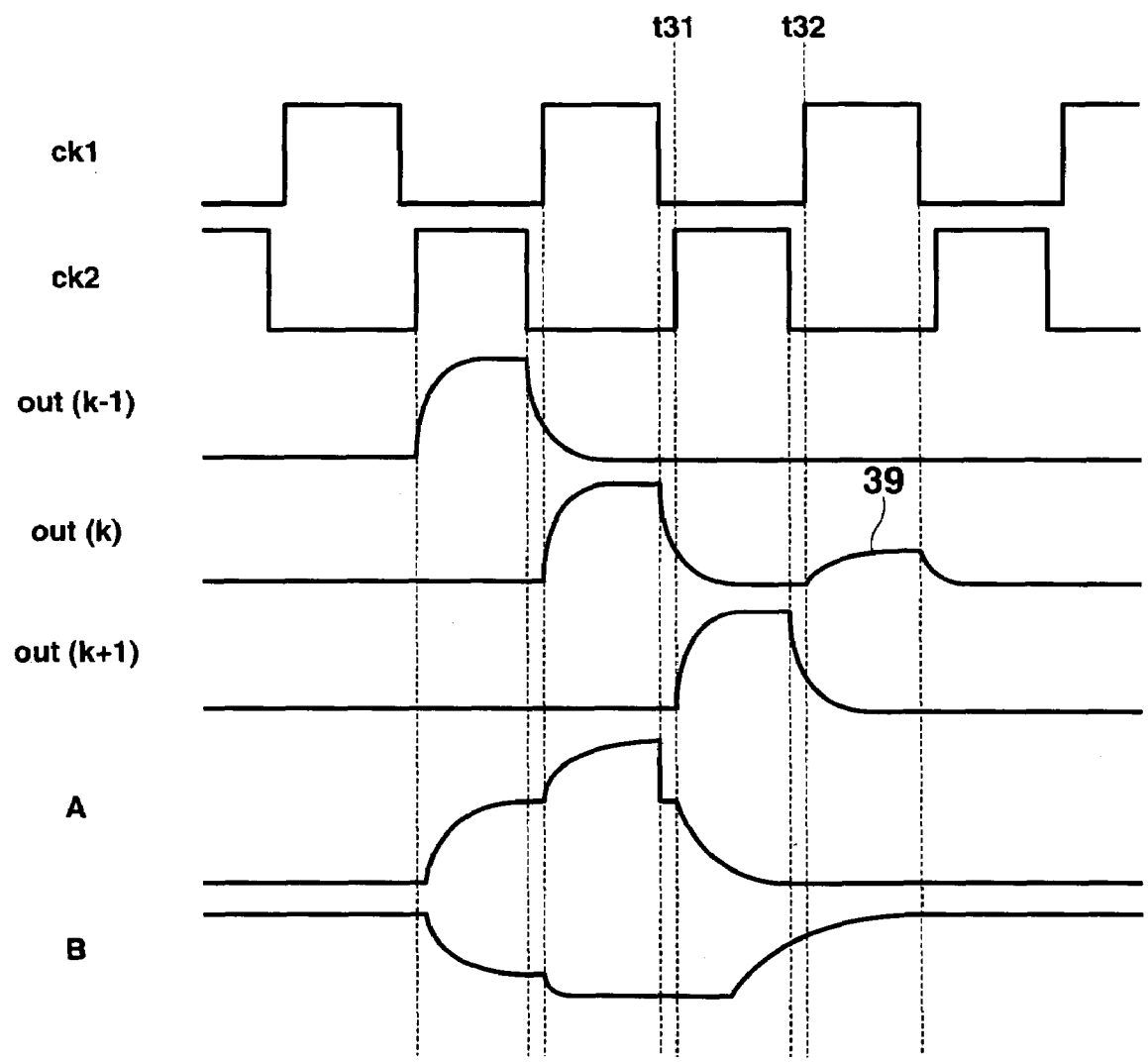
FIG. 7 is a signal waveform diagram illustrating the effects of the shift circuit in accordance with the present embodiment.

FIGS. 6 and 7 are signal waveform diagrams illustrating the adverse effect of the low speed at which the potential at the node B rises.

FIG. 6 shows the following signals in the following order from the top to bottom of the figure: the clock signal ck1, input to the odd numbered shift circuits, the clock signal ck2, input to the even numbered shift circuits, the potential at the node A, the potential at the node B, the output signal out(k−1) from the circuit in the preceding stage, which is input to the input terminal IN, the output signal out(k), output from the output terminal OUT, and the output signal out(k+1) from the circuit in the succeeding stage, which is input to the reset terminal RST. In FIG. 6, at a time t21, the clock signal ck2 changes to the high level. Then, when the high-level output signal out(k+1) from the k+1 output terminal OUT is input to the reset terminal RST, TET 12 is turned on to lower the potential at the node A. This turns off TFT 16 to start raising the potential at the node B. The increase in the potential at the node B turns on TFT 18 to change the output signal out(k) to the low level. However, when the potential at the node B rises slowly, a long time is required for TFT 18 to reach the complete on state. That is, a long time is required to drop the level of the output signal out to round the fall waveform. Consequently, in the shift register in which the plurality of shift circuits are cascaded together, an increase of the frequency of the clock signals ck1 and ck2 gradually enhances the adverse effect of rounding of the waveform. This makes the operation of the circuits unstable.

Further, if the frequency of the clock signals ck1 and ck2 is increased but the potential at the node B does not increase sufficiently before the next clock signal ck1 or ck2 is input, a pseudo clock signal may be generated to cause malfunctioning. FIG. 7 illustrates how such a pseudo clock is generated. In FIG. 7, at a time 31, the output signal out(k+1) from the circuit in the succeeding stage is input to the reset terminal RST to start raising the potential at the node B. However, after the input of the output signal out(k+1), a long time is required to increase the potential at the node B to a high potential level. If the TFT 18 does not reach the complete on state before a rise in the next signal ck1 (time t32), the potential at the output terminal OUT cannot be changed to a sufficiently low level at the time t32. Accordingly, the high-level clock signal ck1 varies the potential of the output signal out(k) as shown at 39. This potential varying portion is called a leakage signal. In the shift register, such a leakage signal may be gradually amplified by the shift circuit in the succeeding stage. The leakage signal may finally become as large as the original clock signal. This is called a pseudo clock signal. If such a pseudo clock signal is generated, it acts similarly to the original clock signal, thus causing the circuits to malfunction. Thus, in the prior art, if after the input of the reset signal to the reset terminal RST, the potential at the node B rises slowly to delay the fall in the output signal, an increase in clock frequency causes the circuits to malfunction. As a result, the clock frequency cannot be increased.

In contrast, in the configuration of the present invention, the shift circuit comprises TFT 19 (fifth transistor). The gate terminal of TFT 19 is connected to the reset terminal RST. The voltage Vdd is applied to the drain terminal. The source terminal is connected to the node B. Accordingly, when the reset signal is input, TFT 19 is turned on to rapidly raise the potential of the node B as shown by a solid line in FIG. 4. Thus, in the shift register using a plurality of the shift circuits, even if the clock frequency of each circuit is increased to some degree, it is possible to suppress unstable circuit operations and the generation of a pseudo clock signal. Therefore, stable circuit operations can be achieved. This allows the clock frequency to be increased.

Now, description will be given of an example of specific values for the shift circuit shown in FIG. 3.

For the voltage values, for example, the voltage Vdd=about 15 [V] and the voltage Vss=about −15 [V]. For the size of each TFT, for example, for TFTs 13, 14, 15, and 19, W=about 100 [μm] and for TFTs 12 ad 17, W=about 200 [μm]. For TFTs 11 and 16, W=about 300 [μm] and for TFT 18, W=about 400 [μm]. For all TFTs, L=about 9 [μm]. If the above register is applied to a scan driver that drives a display panel of frame frequency 60 [Hz] and scan line number 230, the frequency required for the clock signals ck1 and ck2 is about 16 [kHz]. For the clock signals ck1 and ck2, duty ratio is about 80 to 90% and pulse width is about 60 [μsec]. When the shift register conforms to such circuit specifications, the above circuit operations can be achieved. These items are only illustrative and the present invention can be achieved using different circuit specifications.

<Variation>

Figure 8:
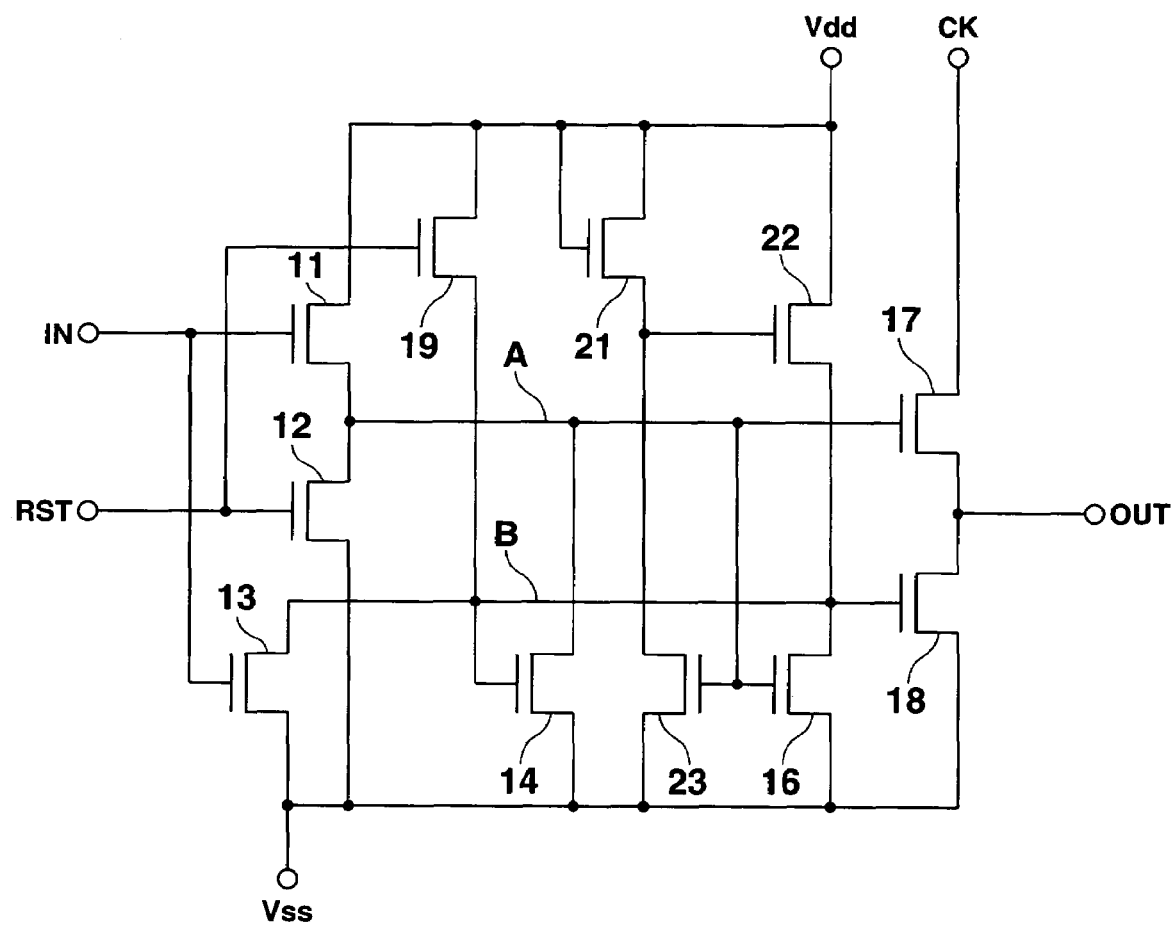
FIG. 8 is a circuit diagram showing a variation of the shift circuit in accordance with the present embodiment.
Figure 9:
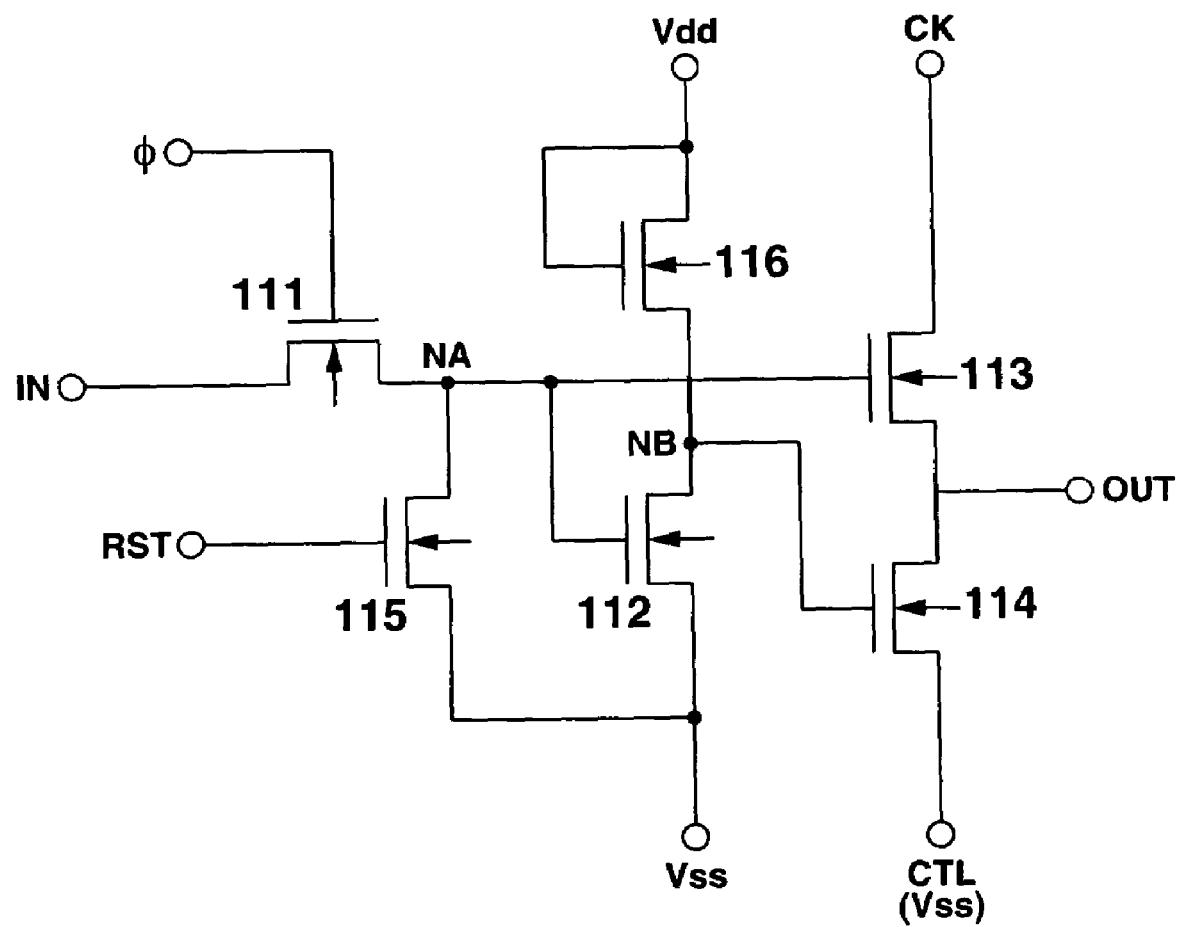
FIG. 9 is a circuit diagram of a shift circuit in accordance with the prior art.

FIG. 8 is a circuit diagram showing a variation of the shift circuit in accordance with the present embodiment.

FIG. 8 shows the circuit shown in FIG. 3 and which is varied as described below. TFT 15 is removed, and TFT 21, TFT 22, and TFT 23 are added. The voltage Vdd is applied to gate and drain terminals of TFT 21. A source terminal of TFT 21 is connected to a gate terminal of TFT 22 and a drain terminal of TET 23. The gate terminal of TFT 22 is connected to the source terminal of TFT 21 and the drain terminal of TFT 23. The voltage Vdd is applied to a drain terminal of TFT 22. A source terminal of TFT 22 is connected to the node B. A gate terminal of TFT 23 is connected to the node A. The drain terminal of TFT 23 is connected to the drain terminal of TFT 21 and the gate terminal of TFT 22. The voltage Vss is applied to a source terminal of TFT 23. The circuit operations are almost similar to those described with reference to FIG. 4. The use of this circuit also enables the realization of a shift register that operates stably and that has an improved frequency characteristic as in the case of FIG. 3.

What is claimed is:

1. A shift register comprising a plurality of stages,
each of the stages comprising one of cascaded shift circuits, each of the shift circuits comprising:
an output terminal which sequentially outputs an output signal and which applies the output signal to the shift circuit in a succeeding stage;
an input terminal to which the output signal from the shift circuit in a preceding stage is applied;
a reset terminal to which the output signal from the shift circuit in the succeeding stage is applied;
a first wiring;
a second wiring;
a section for applying a predetermined voltage to the first wiring in response to the input of the output signal from the shift circuit in the preceding stage to the input terminal and in accordance with the application of the predetermined voltage to the first wiring, outputting an externally applied signal of a predetermined level to the output terminal as the output signal;

a section for reducing a voltage level of the first wiring in response to the application of the output signal to the reset terminal by the shift circuit in the succeeding stage;

a section for applying the predetermined voltage to the second wiring in response to a change in the level of the voltage applied to the first wiring;

a section for applying the predetermined voltage to the second wiring in response to the application of the output signal to the reset terminal by the shift circuit in the succeeding stage; and a section for reducing a voltage level of the output signal in response to the application of the predetermined voltage to the second wiring, wherein the section for outputting the signal of the predetermined level as the output signal has a first transistor which applies the predetermined voltage to the first wiring in response to the input of the output signal to the input terminal, and a second transistor which outputs the signal of the predetermined level to the output terminal wire in response to the application of the predetermined voltage to the first wiring, the section for reducing the voltage level of the first wiring in response to the application of the output signal to the reset terminal has a third transistor, the section for applying the predetermined voltage to the second wiring in accordance with the change in the voltage level of the first wiring has a fourth transistor, the section for applying the predetermined voltage to the second wiring in response to the application of the output signal to the reset terminal has a fifth transistor, and the section for reducing the voltage level of the output signal in response to the application of the predetermined voltage to the second wiring has a sixth transistor.

2. The shift register according to claim 1, wherein the first transistor and the third transistor have current paths connected in series, a junction between the first transistor and the third transistor is connected to the first wiring, and the predetermined voltage is applied to one end of the current paths which is closer to the first transistor, a control terminal of the first transistor is connected to the input terminal, and a control terminal of the third transistor is connected to the reset terminal.

3. The shift register according to claim 1, wherein the second transistor and the sixth transistor have current paths connected in series, a junction between the second transistor and the sixth transistor is connected to the output terminal, and the signal of the predetermined level is applied to one end of the current paths which is closer to the second transistor, a control terminal of the second transistor is connected to the first wiring, and a control terminal of the sixth transistor is connected to the second wiring.

4. The shift register according to claim 1, wherein the fourth transistor has a current path one end of which is connected to the second wiring and a control terminal connected to the first wiring.

5. The shift register according to claim 1, wherein the fifth transistor has a current path having one end to which the predetermined voltage is applied and the other end connected to the second wiring, and a control terminal connected to the reset terminal.

6. The shift register according to claim 1, wherein each of the first to sixth transistor comprises an amorphous silicon thin-film transistor.

7. The shift register according to claim 1, wherein each of the first to sixth transistors comprises a polysilicon thin-film transistor.

8. A display driving device comprising a shift register including a plurality of stages to drive a display panel, wherein each of the stages of the shift register comprises one of cascaded shift circuits, the shift circuit comprising:

an output terminal which sequentially outputs an output signal and which applies the output signal to the shift circuit in a succeeding stage;

an input terminal to which the output signal from the shift circuit in a preceding stage is applied;

a reset terminal to which the output signal from the shift circuit in the succeeding stage is applied;

a first wiring;

a second wiring;

a section for applying a predetermined voltage to the first wiring in response to the input of the output signal from the shift circuit in the preceding stage to the input terminal;

a section for outputting an externally applied signal of a predetermined level to the output terminal as the output signal, in response to the application of the predetermined voltage to the first wiring;

a section for reducing a voltage level of the first wiring in response to the application of the output signal to the reset terminal by the shift circuit in the succeeding stage;

a section for applying the predetermined voltage to the second wiring in response to a change in the level of the voltage applied to the first wiring;

a section for applying the predetermined voltage to the second wiring in response to the application of the output signal to the reset terminal by the shift circuit in the succeeding stage; and a section for reducing a voltage level of the output signal in response to the application of the predetermined voltage to the second wiring, wherein the section for applying the predetermined voltage to the first wiring in response to the input of the output signal to the input terminal has a first transistor, a section for outputting the signal of the predetermined level to the output terminal wire in response to the application of the predetermined voltage to the first wiring has a second transistor, the section for reducing the voltage level of the first wiring in response to the application of the output signal to the reset terminal has a third transistor, the section for applying the predetermined voltage to the second wiring in accordance with the change in the voltage level of the first wiring has a fourth transistor, the section for applying the predetermined voltage to the second wiring in response to the application of the output signal to the reset terminal has a fifth transistor, and the section for reducing the voltage level of the output signal in response to the application of the predetermined voltage to the second wiring has a sixth transistor.

9. The display driving device according to claim 8, wherein the first transistor and the third transistor have current paths connected in series, a junction between the first transistor and the third transistor is connected to the first wiring, and the predetermined voltage is applied to one end of the current paths which is closer to the first transistor, a control terminal of the first transistor is connected to the input terminal, and a control terminal of the third transistor is connected to the reset terminal.

10. The display driving device according to claim 8, wherein the second transistor and the sixth transistor have current paths connected in series, a junction between the second transistor and the sixth transistor is connected to the output terminal, and the signal of the predetermined level is applied to one end of the current paths which is closer to the second transistor, a control terminal of the second transistor is connected to the first wiring, and a control terminal of the sixth transistor is connected to the second wiring.

11. The display driving device according to claim 8, wherein the fourth transistor has a current path one end of which is connected to the second wiring and a control terminal connected to the first wiring.

12. The display driving device according to claim 8, wherein the fifth transistor has a current path having one end to which the predetermined voltage is applied and the other end connected to the second wiring, and a control terminal connected to the reset terminal.

13. The display driving device according to claim 8, wherein the first to sixth transistors comprise amorphous silicon thin-film transistors.

14. The display driving device according to claim 8, wherein the first to sixth transistors comprise polysilicon thin-film transistors.

* * * * *